(12) United States Patent
Cassidy et al.

(10) Patent No.: US 6,221,193 B1
(45) Date of Patent: Apr. 24, 2001

(54) DEFECT REDUCTION METHOD FOR SCREENED GREENSHEETS AND ARTICLE PRODUCED THEREFROM

(75) Inventors: Richard J. Cassidy, Newburgh; John R. Lankard, Jr., Poughkeepsie; Jawahar P. Nayak, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/233,889

(22) Filed: Jan. 20, 1999

(51) Int. Cl.[7] .............................. B32B 31/12; B32B 18/00
(52) U.S. Cl. ...................... 156/267; 156/252; 156/89.12; 427/97; 428/689; 428/699
(58) Field of Search ............................. 156/89.12, 89.16, 156/252, 267; 427/96, 97; 428/210, 901; 264/614, 619, 542.8, 689, 699

(56) References Cited

U.S. PATENT DOCUMENTS

| | | | |
|---|---|---|---|
| 4,871,608 | * 10/1989 | Kondo et al. | 428/210 X |
| 5,528,135 | * 6/1996 | Kawamura et al. | . |
| 5,543,661 | * 8/1996 | Sumida | . |
| 5,573,620 | * 11/1996 | Sakai et al. | 156/252 X |
| 5,578,151 | * 11/1996 | Andris et al. | . |
| 5,628,850 | 5/1997 | Sanchez et al. | 156/89 |
| 5,755,903 | * 5/1998 | Garant et al. | . |
| 5,759,669 | * 6/1998 | Casey et al. | 428/901 X |
| 5,891,543 | * 4/1999 | Casey et al. | . |
| 5,927,193 | * 7/1999 | Balz et al. | . |

FOREIGN PATENT DOCUMENTS

| | | |
|---|---|---|
| 1-179389 | 1/1989 | (JP) . |
| 4-169082 | 6/1992 | (JP) . |
| 7-066076 | 3/1995 | (JP) . |
| 7-111374 | * 4/1995 | (JP) . |
| 11-31881 | * 2/1999 | (JP) . |
| 11-312762 | * 11/1999 | (JP) . |

* cited by examiner

Primary Examiner—Curtis Mayes
(74) Attorney, Agent, or Firm—Ira D. Blecker

(57) ABSTRACT

Disclosed is a method for reducing screening defects on ceramic greensheets which includes placing additional vias in the kerf that will be eventually discarded during the sizing operation. Also disclosed is a ceramic substrate laminate article with reduced screening defects.

15 Claims, 3 Drawing Sheets

DEFECT REDUCTION METHOD FOR SCREENED GREENSHEETS AND ARTICLE PRODUCED THEREFROM

BACKGROUND OF THE INVENTION

The present invention relates to the reducing of defects occurring during the screening of ceramic greensheets and, more particularly, relates to the addition of nonfunctional vias which alleviate certain defects occurring during the screening of ceramic greensheets.

Ceramic multilayer substrates are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, I/O connector pads, etc. Interconnection between buried conductor levels can be achieved through vias formed by metal paste-filled holes in the individual ceramic layers formed prior to lamination which, upon sintering, will become a sintered dense metal interconnection of metal-based conductor.

In general, conventional multilayered ceramic substrates are formed from ceramic greensheets which are prepared by mixing a ceramic particulate, a thermoplastic polymer binder, plasticizers, and solvents. This composition is spread or cast into ceramic sheets or slips from which the solvents are subsequently volatilized to provide coherent and self-supporting flexible greensheets. After blanking and punching, the greensheets are screened with a metallic paste to fill the vias and form wiring patterns on the greensheets. The greensheets are then stacked, laminated and fired at temperatures sufficient to drive off the polymeric binder resin and sinter the ceramic particulates together into a densified substrate.

When screening the ceramic greensheets with the metallic paste, defects called "fly-backs" can occur. After completing the screening of the metallic paste, the screening mask is removed. The removal of the screening mask from the screened greensheet can pull the ceramic greensheet away from the backing material due to insufficient paste adhesion between the ceramic greensheet and the backing material which can cause extra metallic paste to be deposited onto the back surface of the ceramic greensheet, resulting in fly-backs. Also, paste smears and oversize vias can occur as a result of the separation of the screening mask from the ceramic greensheet. Fly-backs, paste smears and oversize vias cause the ceramic greensheet to be rejected.

To overcome these and other defects occurring during screening, it would be desirable to have a process for reducing such defects.

Accordingly, it is a purpose of the present invention to have a method of reducing defects occurring during the screening of ceramic greensheets.

It is another purpose of the present invention to have an article produced by a method in which there is reduced screening defects.

Sanchez et al. U.S. Pat. No. 5,628,850, the disclosure of which is incorporated by reference herein, discloses a method for producing input/output connections in a ceramic device wherein at least one via is punched at the outer edge of the active area of the ceramic device and then filled with conductive paste. A score line is produced through the center of the via. After sintering, the ceramic device is cleaved along the score line, including through the scored via, to form the ceramic device having an input/output connection.

Shinichi Japanese Published Unexamined Patent Application 07-066076, the disclosure of which is incorporated by reference herein, discloses a ceramic substrate laminate having a plurality of through holes of rhombic shape punched therein to prevent cracking of the individual ceramic substrate laminates when they are diced from the ceramic substrate laminate.

Yasufumi Japanese Published Unexamined Patent Application 04-169082, the disclosure of which is incorporated by reference herein, discloses a ceramic substrate made by a greensheet having a plurality of through holes filled with a conductive paste and then cut apart through the filled through holes.

Taiyo Yuden KK Japanese Patent 01-179389, the disclosure of which is incorporated by reference herein, discloses a ceramic substrate formed by dicing ceramic laminates on a line passing through the through holes.

BRIEF SUMMARY OF THE INVENTION

One aspect of the invention relates to a method to reduce defects during screening of paste through a mask onto ceramic greensheets, the method comprising the steps of:

partitioning a greensheet into a plurality of active areas which will form part of a finished ceramic substrate and kerf which will be discarded in a subsequent manufacturing step;

punching a plurality of vias in each of the active areas of the greensheet and punching a plurality of vias in at least part of the kerf of the greensheet; and screening paste into both sets of vias through a mask, the paste-filled vias in the kerf causing increased adhesion between the greensheet and backing sheet.

A second aspect of the invention relates to an article with reduced screening defects comprising:

a greensheet partitioned into a plurality of active areas which will form part of a finished ceramic substrate and kerf which will be discarded in a subsequent manufacturing step, and each of the active areas of the greensheet and at least part of the kerf having a plurality of paste-filled vias.

A third aspect of the invention relates to an article with reduced screening defects comprising:

a greensheet laminate comprising a plurality of greensheets, each of which is partitioned into a plurality of active areas which will form part of a finished ceramic substrate and kerf which will be discarded in a subsequent manufacturing step, and each of the active areas of the greensheet and at least part of the kerf having a plurality of paste-filled vias.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
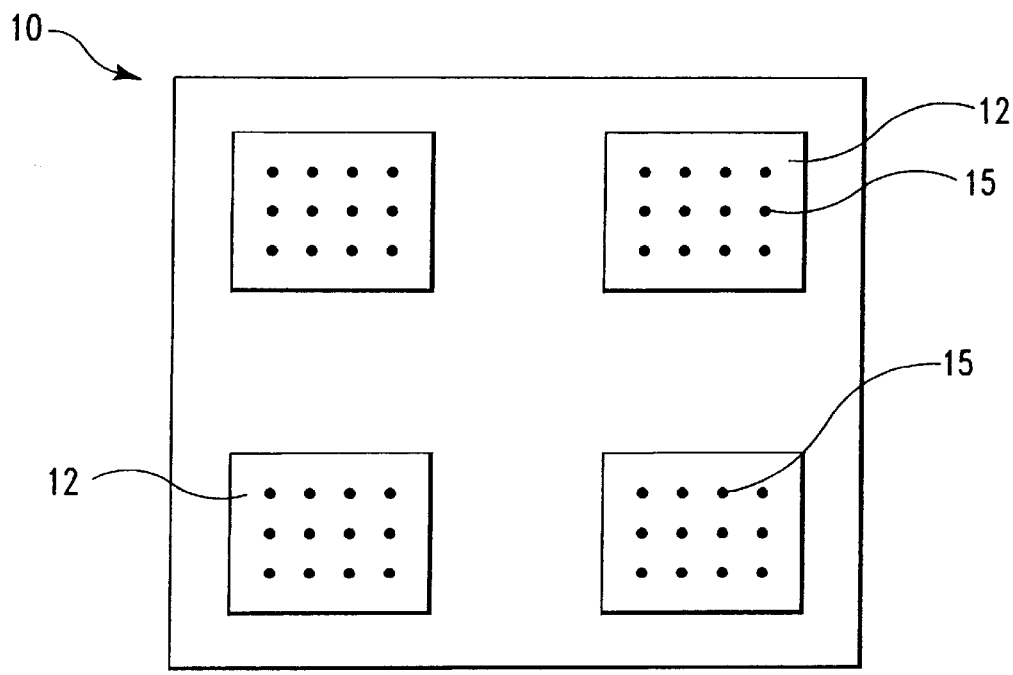
FIG. 1 is a plan view of a prior art ceramic greensheet.

Referring to the drawings in more detail, and particularly referring to FIG. 1, there is shown a prior art ceramic greensheet 10. Ceramic greensheet 10 is partitioned into a plurality of active areas 12. When the ceramic greensheet 10 has been stacked with other like ceramic greensheets, sized and sintered, each of the active areas 12 will form the basis for a functioning ceramic substrate suitable for receiving an electronic device such as an integrated circuit device. As shown in FIG. 1, ceramic greensheet 10 will be used to manufacture four ceramic substrates. For manufacturing efficiency, modern day ceramic substrates are made in such multiples, called "ups".

Each of the active areas 12 contains vias and/or wiring circuitry. As shown in FIG. 1, active areas 12 only contain paste-filled vias 15.

Figure 2:
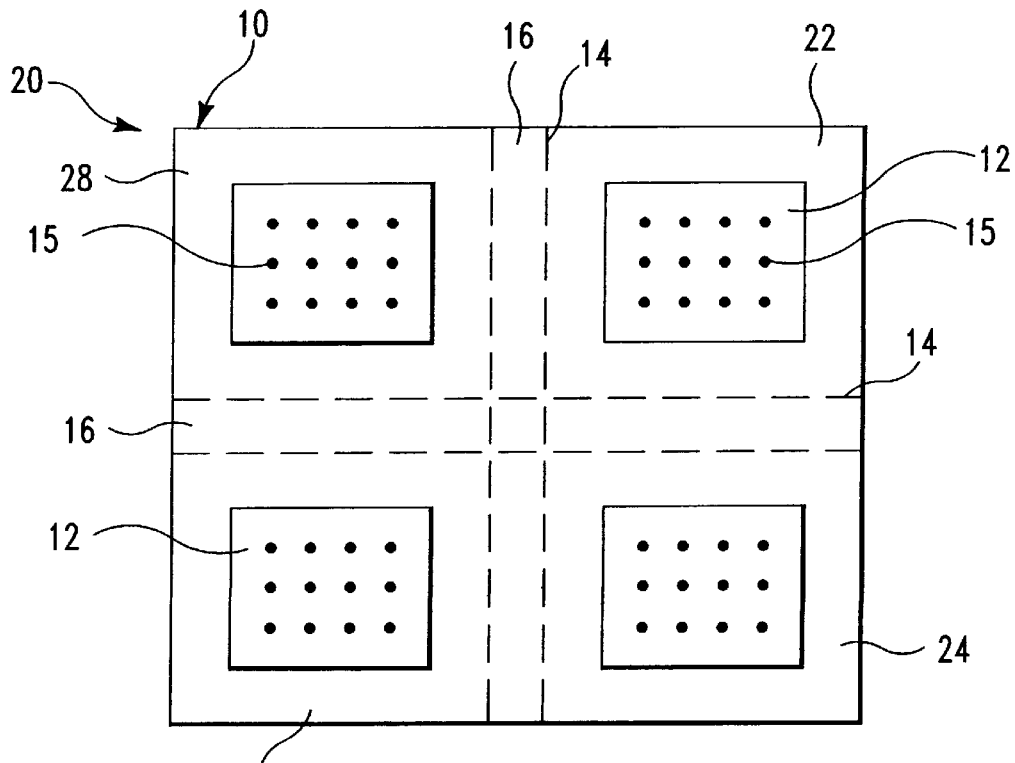
FIG. 2 is a plan view of a prior art ceramic substrate laminate.

A plurality of similar ceramic greensheets would be formed and stacked in conventional manner to form the ceramic substrate laminate 20 shown in FIG. 2. Ceramic greensheet 10 shown in FIG. 1 is the top layer of ceramic substrate laminate 20. During a subsequent "sizing" operation, ceramic substrate laminate 20 will be cut or sawn along lines 14 and 17 into four smaller ceramic substrate laminates 22, 24, 26, 28. When sintered, ceramic substrate laminates 22, 24, 26, 28 will form fully functioning ceramic substrates. The area 16 between the lines 14 and the area 19 between lines 17 and the edge 21 of the ceramic substrate laminate 20 is called the kerf and is discarded as a result of the sizing operation.

There is typically no screening of paste for vias, conductive lines or any other structures in the kerf since the kerf is discarded during sizing. The present inventors have discovered, however, that due to the lack of screened paste between active areas 12, defects such as fly-backs, paste smears and oversized vias can occur on the individual greensheets as a result of screening. The present inventors have further found that the number of defects increases with the number of ups.

Accordingly, the present inventors have proposed adding paste-filled vias in the kerf area to decrease the defects normally occurring during screening.

Figure 3:
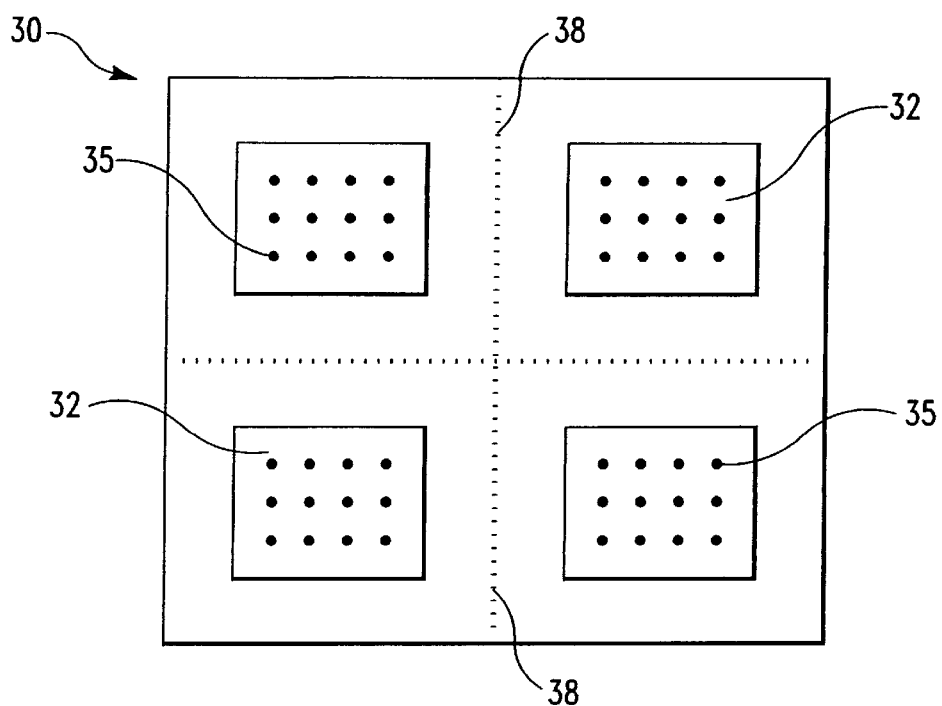
FIG. 3 is a plan view of a ceramic greensheet according to the present invention.

Referring now to FIG. 3, there is shown a ceramic greensheet 30 containing active areas 32. According to the present invention, however, between the active areas 32 are a plurality of paste-filled, non-functional vias 38 wholly contained in the kerf 36. As in the prior art ceramic greensheet, the active areas 32 contain vias and/or conductive wiring lines. In the particular embodiment shown in FIG. 3, the active areas 32 contain only vias 35.

Ceramic greensheet 30 is then stacked with other similar ceramic greensheets in conventional manner to form ceramic substrate laminate 40. Each of the ceramic greensheets in ceramic substrate laminate 40 would contain the paste-filled vias 38 similar to ceramic greensheet 30. The ceramic substrate laminate 40 is then sized by cutting or sawing along lines 34 and 37 to form smaller ceramic substrate laminates 42, 44, 46, 48. The kerf 36 (i.e., the area between lines 34) and vias 38 would be discarded. Kerf 39 (i.e., the area between lines 37 and the edge 41 of the ceramic substrate laminate 40) would also be discarded. Kerf 39 does not contain any vias.

The inventors have found that placement of vias 38 between the active areas 32 has substantially reduced or eliminated the previously-described screening defects.

The vias 38 are most preferably wholly contained within the kerf 36 so that when the kerf is removed after cutting or sawing, the vias 38 are entirely removed, thereby removing any electrical or appearance effect the vias 38 might otherwise have on each of the smaller ceramic substrate laminates 42, 44, 46, 48.

Figure 4:
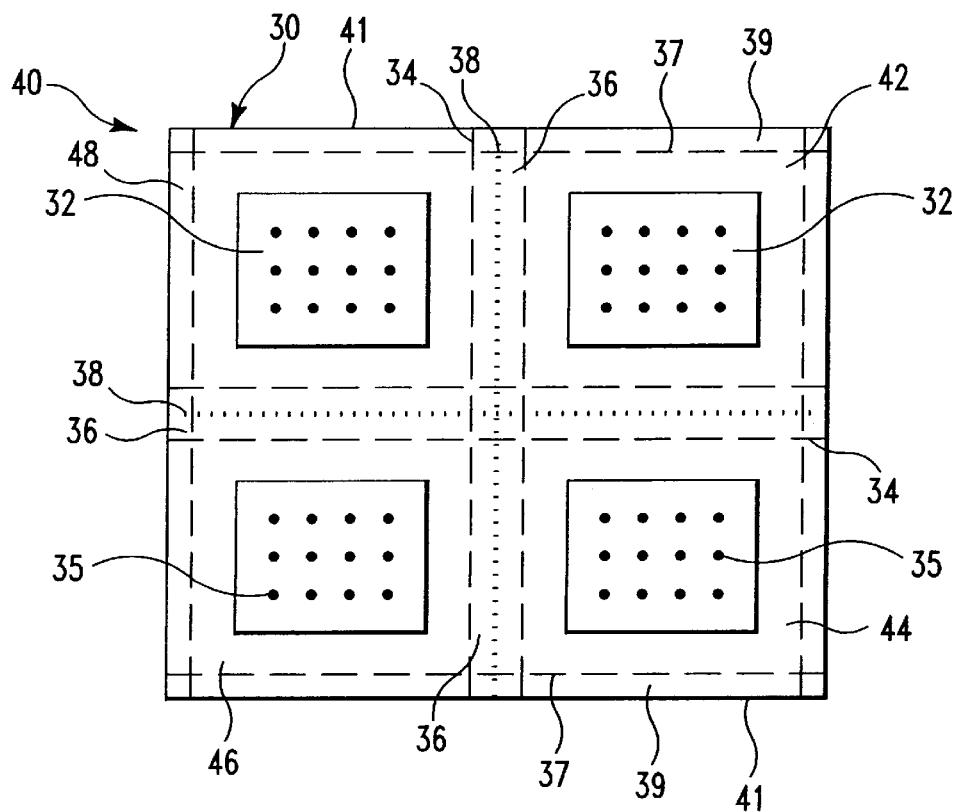
FIG. 4 is a plan view of a ceramic substrate laminate according to the present invention.
Figure 5:
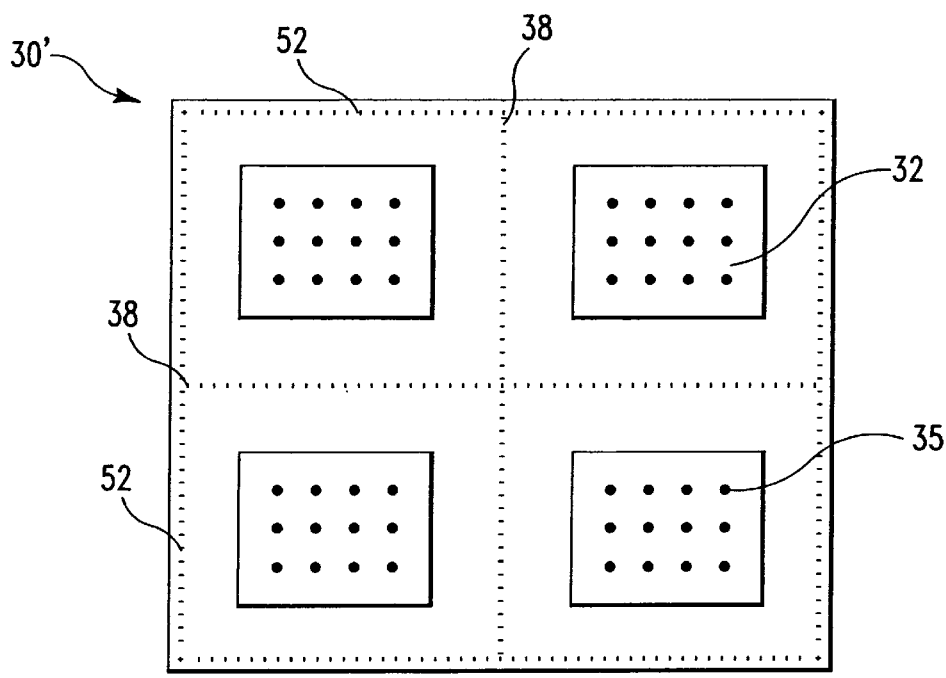
FIG. 5 is a plan view of a second embodiment of the ceramic greensheet according to the present invention.
Figure 6:
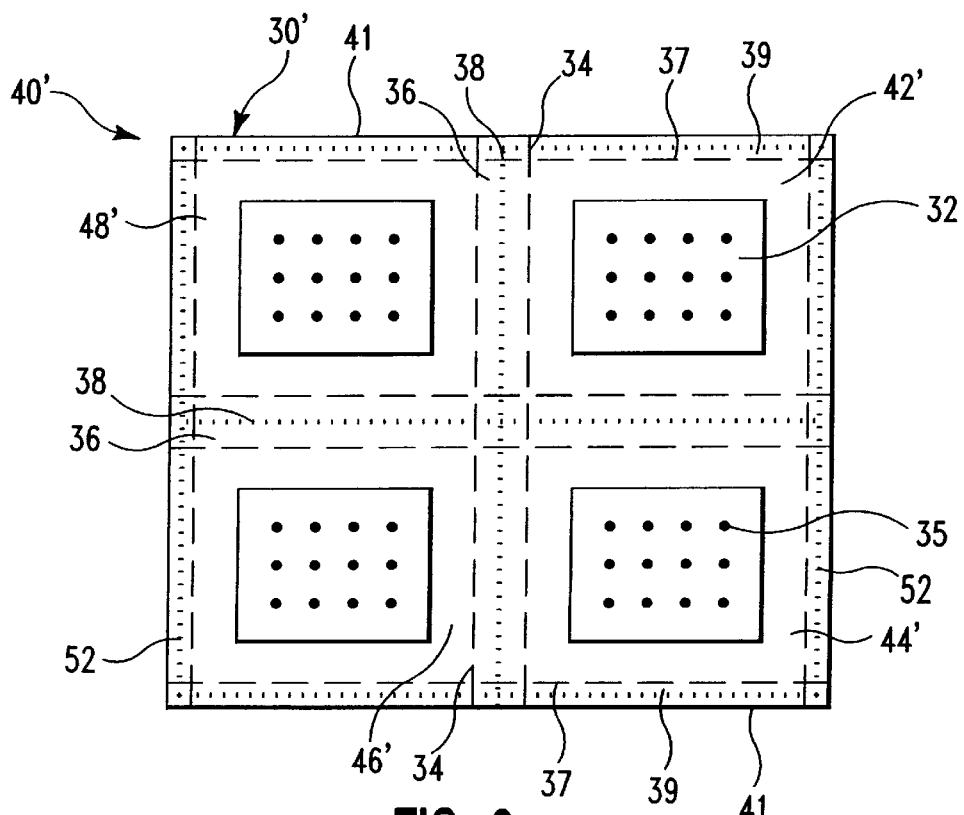
FIG. 6 is a plan view of a second embodiment of the ceramic substrate laminate according to the present invention.

Referring now to FIGS. 5 and 6, there is shown a second embodiment of the ceramic greensheet and ceramic substrate laminate shown in FIGS. 4 and 5, respectively. In extreme cases, it may be necessary to place paste-filled nonfunctional vias along the edge of the ceramic greensheet, such as vias 52 on ceramic greensheet laminate 30' shown in FIG. 5 (and in the kerf 39 shown in FIG. 6), in addition to paste-filled vias 38 in the kerf 36. Preferably, vias 52 should be wholly contained within kerf 39. If vias 52 are utilized, their position on each ceramic greensheet should be staggered with respect to the ceramic greensheet above and below it to avoid excess thickness at the edges of the sintered substrate.

Then, when the ceramic substrate laminate 40' is cut or sawn along lines 34 and 37 shown in FIG. 6, vias 52 will be discarded along with kerf 39.

The non-functional vias 38, 52 in the embodiments shown in FIGS. 3 to 6 should be evenly or uniformly spaced on the ceramic greensheet 30, 30'. The actual number of nonfunctional vias 38, 52 would depend on the size of the ceramic greensheet, the size of the via and the active pattern area. As an example, for a 185 mm ceramic greensheet, the present inventors have found that there should be a minimum of one hundred (100) 6 mil vias in the kerf 36. The actual number and size of non-functional vias 38, 52 for any given ceramic greensheet application can be easily optimized through routine experimentation by a person skilled in the art given the teachings of the present invention.

In addition, while the nonfunctional vias can be located only in the kerf 36 or in both the kerf 36 and kerf 39, the nonfunctional vias should not be located only in kerf 39 as this could lead to screening defects.

The advantages of the invention will be more apparent after reference to the following example:

EXAMPLE

Four hundred (400) 185 mm. ceramic greensheets were screened on the same screening apparatus with the same masks except that two hundred (200) of the ceramic greensheets had one hundred (100) 6 mil vias in the kerf (similar to that shown in FIG. 3) and the other two hundred (200) ceramic greensheets did not. In the ceramic greensheets that had the vias in the kerf, the vias were uniformly spaced with approximately fifty (50) in each of the X and Y directions.

After screening each of the ceramic greensheets with a metallic paste, the ceramic greensheets were inspected for defects. Of the two hundred (200) ceramic greensheets without the kerf vias, one hundred twenty (120) failed because of fly-back defects. Of the two hundred (200)

ceramic greensheets with the kerf vias, only two (2) failed and these failures were for reasons other than fly-back defects.

According to the present invention, 99% of the ceramic greensheets were screened without fly-back defects while only 40% of the prior art ceramic greensheets could be screened without fly-back defects, clearly demonstrating the efficiency of the present invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method to reduce defects during screening of paste through a mask onto ceramic greensheets, the method comprising the steps of:

partitioning a greensheet into a plurality of active areas which will form part of a finished ceramic substrate and kerf which will be discarded in a subsequent manufacturing step;

punching a plurality of vias in each of the active areas of the greensheet and punching a plurality of nonfunctional vias in at least part of the kerf of the greensheet; and screening paste into both sets of vias through a mask, the nonfunctional paste-filled vias in the kerf causing increased adhesion between the greensheet and backing sheet.

2. The method of claim 1 further comprising the steps of:

repeating the steps of partitioning, punching and screening until a plurality of greensheets are obtained;

stacking and laminating the plurality of greensheets to form a greensheet laminate;

sizing the greensheet laminate so as to separate each of the active areas from the kerf; and discarding the kerf.

3. The method of claim 2 wherein the kerf that contains the vias is located between the active areas of the greensheet laminate.

4. The method of claim 3 wherein the kerf that contains the vias is additionally located between at least one active area of the greensheet laminate and an edge of the greensheet laminate.

5. The method of claim 1 wherein the plurality of vias in the kerf are contained wholly within the kerf.

6. The method of claim 1 wherein the kerf that contains the vias is located between the active areas of the greensheet.

7. The method of claim 6 wherein the kerf that contains the vias is additionally located between at least one active area of the greensheet and an edge of the greensheet.

8. An article with reduced screening defects comprising:

a greensheet partitioned into a plurality of active areas which will form part of a finished ceramic substrate and kerf which will be discarded in a subsequent manufacturing step, and each of the active areas of the greensheet having a plurality of paste-filled vias and at least part of the kerf having a plurality of nonfunctional paste-filled vias.

9. The article of claim 8 wherein the plurality of vias in the kerf are contained wholly within the kerf.

10. The article of claim 8 wherein the kerf that contains the vias is located between the active areas of the greensheet.

11. The article of claim 10 wherein the kerf that contains the vias is additionally located between at least one active area of the greensheet and an edge of the greensheet.

12. An article with reduced screening defects comprising:

a greensheet laminate comprising a plurality of greensheets, each of which is partitioned into a plurality of active areas which will form part of a finished ceramic substrate and kerf which will be discarded in a subsequent manufacturing step, and each of the active areas of the greensheet having a plurality of paste-filled vias and at least part of the kerf having a plurality of nonfunctional paste-filled vias.

13. The article of claim 12 wherein the plurality of vias in the kerf are contained wholly within the kerf.

14. The article of claim 12 wherein the kerf that contains the vias is located between the active areas of the greensheet laminate.

15. The article of claim 14 wherein the kerf that contains the vias is additionally located between at least one active area of the greensheet laminate and an edge of the greensheet laminate.

* * * * *